(12) United States Patent
Seethamraju

(10) Patent No.: US 7,459,948 B2
(45) Date of Patent: Dec. 2, 2008

(54) PHASE ADJUSTMENT FOR A DIVIDER CIRCUIT

(75) Inventor: Srisai Rao Seethamraju, Nashua, NH (US)

(73) Assignee: Silicon Laboratories Inc., Austin, TX (US)

( * ) Notice: Subject to any disclaimer, the term of this patent is extended or adjusted under 35 U.S.C. 154(b) by 30 days.

(21) Appl. No.: 11/170,957

(22) Filed: Jun. 30, 2005

(65) Prior Publication Data

US 2007/0001718 A1    Jan. 4, 2007

(51) Int. Cl.
*H03B 19/00* (2006.01)

(52) U.S. Cl. .................. 327/117; 327/115; 375/373; 377/47

(58) Field of Classification Search .......... 325/115, 325/117, 147, 149, 153–156, 158–163; 327/115, 327/117, 147, 149, 153–156, 158–163; 377/47, 377/48; 331/17, 25; 375/373–376
See application file for complete search history.

(56) References Cited

U.S. PATENT DOCUMENTS 4,229,824 A * 10/1980 En ........................ 375/373
4,829,544 A * 5/1989 Oyagi et al. ............. 375/373
2006/0140321 A1* 6/2006 Tell et al. ................ 375/376

* cited by examiner

*Primary Examiner*—Lincoln Donovan
*Assistant Examiner*—William Hernandez
(74) *Attorney, Agent, or Firm*—Zagorin O'Brien Graham LLP

(57) ABSTRACT

A divider circuit receives an input signal and at least one phase adjustment control signal and supplies a phase adjustable output signal. The divider circuit includes a state machine providing N states, with no phase adjustment, to provide as the output signal the input signal divided by N. Each state of the state machine lasts for one period of the input signal. The divider circuit adjusts the phase of the output signal by changing the number of states that occur in one period of the output signal. In response to a control signal to decrement the phase of the output signal, the state machine skips at least one state for one period of the output signal. In response to a control signal to increment the phase of the output signal, the state machine inserts one or more states for one period of the output signal.

14 Claims, 9 Drawing Sheets

PHASE ADJUSTMENT FOR A DIVIDER CIRCUIT

CROSS-REFERENCE TO RELATED APPLICATION(S)

BACKGROUND

1. Field of the Invention

This invention relates to divider circuits and more particularly to adjusting a phase of an output of the divider circuit.

2. Description of the Related Art

In high speed clock applications, it is common to try and adjust the output phase of the clock output of a divider circuit that divides a high frequency clock. A typical implementation tries to achieve a resolution of the phase adjustment that is one period of the high frequency clock input.

One approach to adjust the phase of the output clock of a divider is to temporarily change the divide ratio. The basic idea of phase adjustment of the output clock of a clock divider by temporarily changing the divide ratio is illustrated in the waveforms shown in FIGS. 1A and 1B. FIG. 1A shows a phase increment adjustment and FIG. 1B shows a phase decrement adjustment.

FIG. 2A is a block diagram of a divider circuit that performs a divide by N. The divider circuit 200 receives an input clock CLKIN and supplies an output clock CLKOUT. When a phase change is desired, the divide ratio is changed from N to N−1 or N+1 for one low frequency output clock (CLKOUT) period based on whether a phase decrement or an increment is desired. The divider circuit 200 receives phase adjust signals SC and SA that respectively cause the divider circuit 200 to change the divide ratio to N+1 and N−1 for one cycle of the output clock.

In the waveforms of FIGS. 1A and 1B, a divide by 4 is illustrated, i.e., N=4. In the example in FIG. 1A, the input clock CLKIN is normally divided by four so the output clock has four input clock periods for the output clock periods 100 and 102.

Referring to FIG. 2B, illustrated is a circuit generating a pulse SC used to cause a phase increment. Referring to FIGS. 1A and 2B, pulsing the INC input 205 results in a pulse on input SC 210 of the divider 200 for one period of the output clock CLKOUT. The one period 101 in FIG. 1 has N+1 input clock periods. That results in the rising edge of the next rising edge of output clock CLKOUT coming out one CLKIN period later.

A circuit causing a pulse used to cause a decrement pulse is shown in FIG. 2C. A pulse on DEC 207, indicating a desire to decrement the phase of the output signal, results in an output pulse on SA 212 being supplied to the divider 200. The resulting decrement operation is illustrated in FIG. 1B. Normally, the input clock CLKIN is divided by four to generate the output clock CLKOUT as shown at 110, 112, and 114. However, as a result of SA being asserted, the period of the output clock is shortened by one input clock period at 111. That causes the rising edge of the output clock CLKOUT to occur one input clock period earlier, thus adjusting its phase.

However, the brute force approach of changing the divide ratio directly for one cycle of the output clock does not work very well for high frequency applications. One issue is the difficulty in meeting timing requirements while changing the divide ratio. Other issues are glitching, higher power consumption, the complexity of implementation, and increased jitter in some cases.

Accordingly, it would be desirable to provide an improved approach to dividing high speed clock signals.

SUMMARY

An alternative and simpler implementation that overcomes the above drawbacks exploits the state transitions that occur in a divider circuit. In one embodiment a method is provided for adjusting a phase of an output of a divider circuit. The method includes receiving an input signal at an input of the divider circuit that also receives one or more phase adjust control signals. When the one or more phase adjust control signals indicate no phase adjust, the divider divides the input signal by N utilizing a state machine with N states to provide an output signal equal to the input signal divided by N, N being an integer greater than 2. In response to a phase adjust indication from the one or more phase adjust signals, the divider circuit implements a phase adjust of the output signal by adjusting a number of states that occur in the divider circuit.

In another embodiment a divider circuit is provided. The divider circuit receives an input signal and at least one phase adjustment control signal and supplies an output signal, which is a divided down input signal. The divider circuit includes a state machine providing N states, with no phase adjustment, to provide as the output signal the input signal divided by N, each state lasting for one period of the input signal. The divider circuit is responsive to a phase adjustment control signal to adjust the number of states that occur in one period of the output signal to adjust a phase of the output signal. In response to a control signal to decrement the phase of the output signal, the state machine skips at least one state for one period of the output signal to provide an output signal having N−1 or fewer input clock periods for the one period. In response to a second control signal to increment the phase of the output signal, the state machine inserts one or more states for one period of the output signal to provide an output signal having at least N+1 input clock periods for the one period.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF EXEMPLARY EMBODIMENT(S)

Figure 1A:
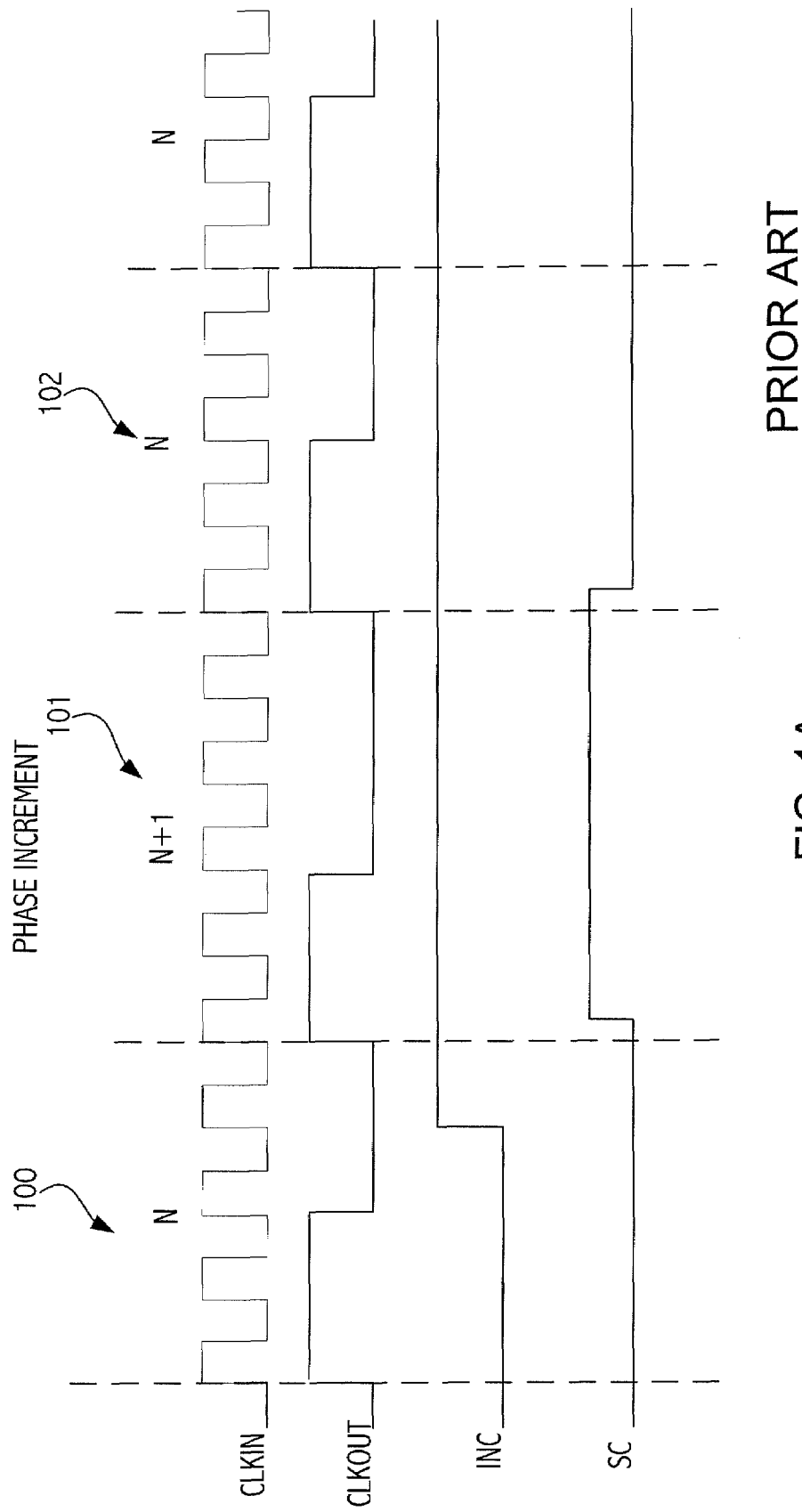
FIG. 1A illustrates a timing diagram of a divide operation that includes a phase increment.
Figure 1B:
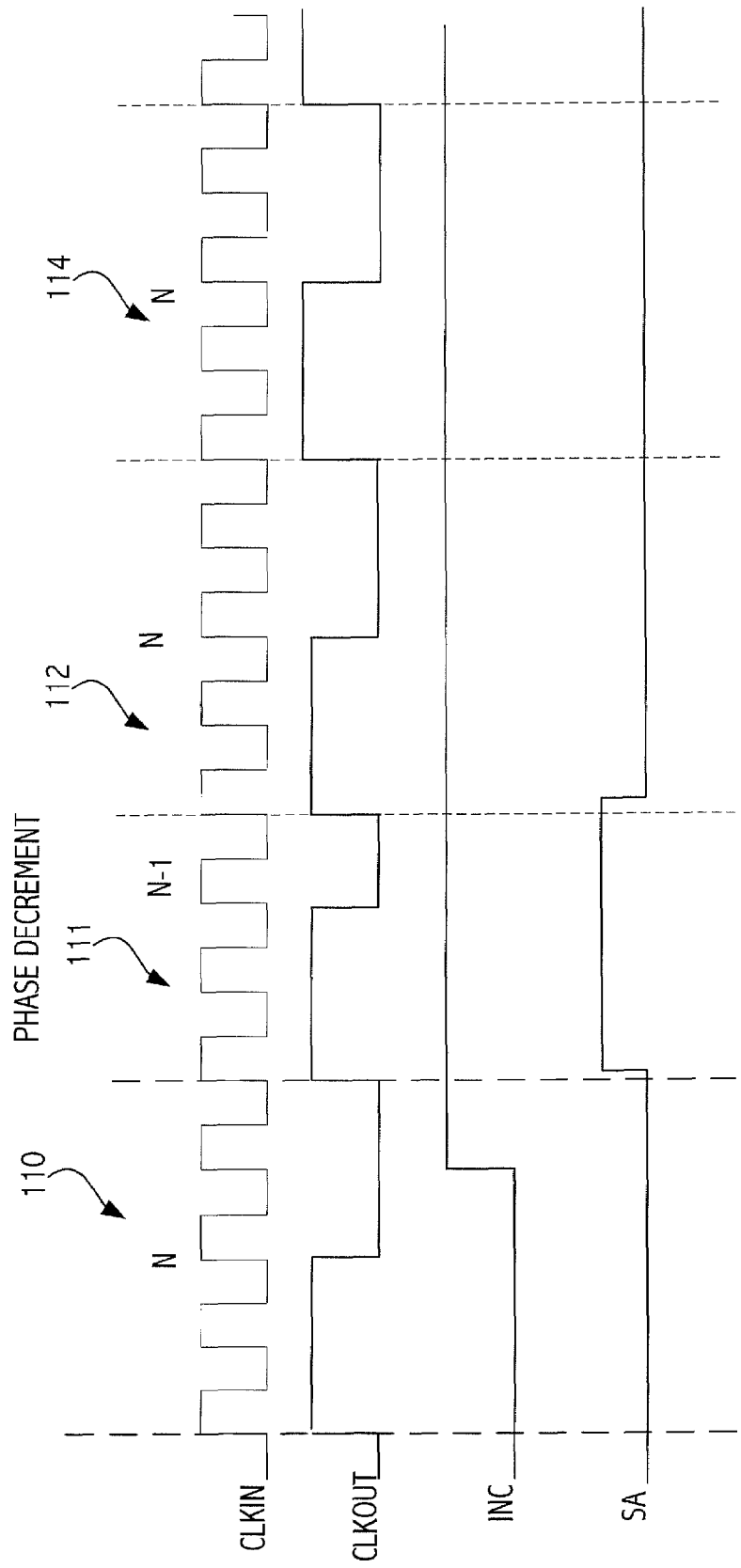
FIG. 1B illustrates a timing diagram of a divide operation that includes a phase decrement.
Figure 2A:
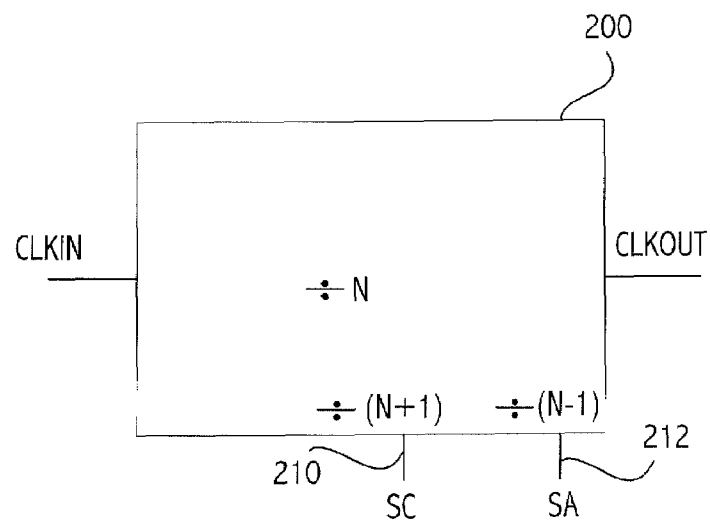
FIG. 2A is a block diagram of a divider circuit that performs a divide by N.
Figure 2B:
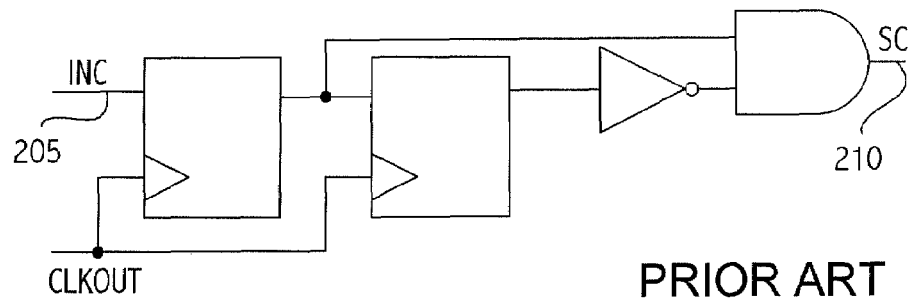
FIG. 2B illustrates a circuit for generating a phase increment pulse.
Figure 2C:
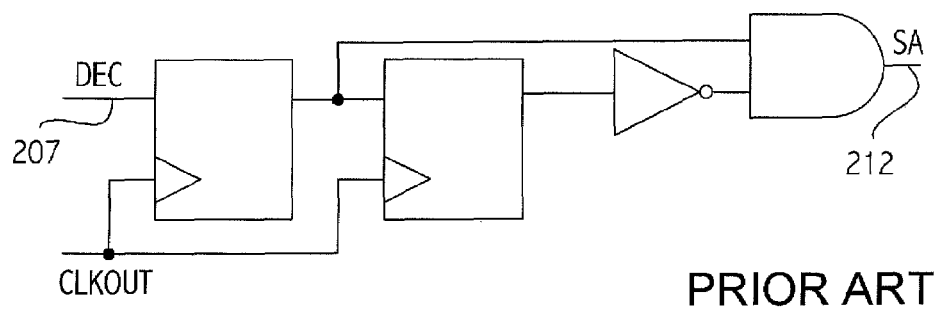
FIG. 2C illustrates a circuit for generating a phase decrement pulse.
Figure 3:
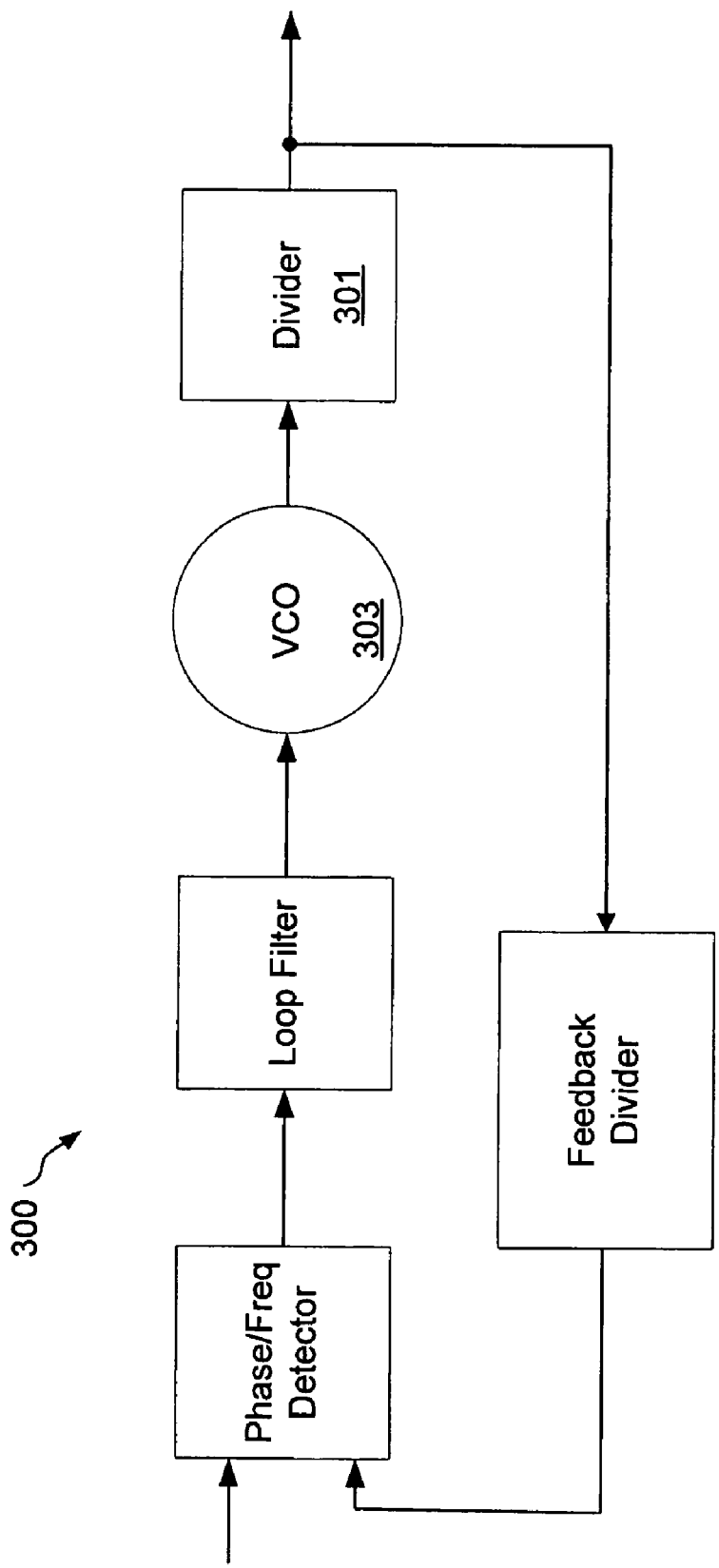
FIG. 3 is a block diagram of an exemplary phase-locked loop (PLL) where embodiments of the divider circuit described herein may be utilized.

The divider described herein is well suited for high speed applications due to its simplicity. One such application is illustrated in FIG. 3, which illustrates a phase-locked loop 300. The phase-locked loop includes a divider 301 coupled to the output of VCO 303. In an exemplary embodiment, the VCO 303 generates a 5 GHz signal that is supplied to the divider.

Figure 4A:
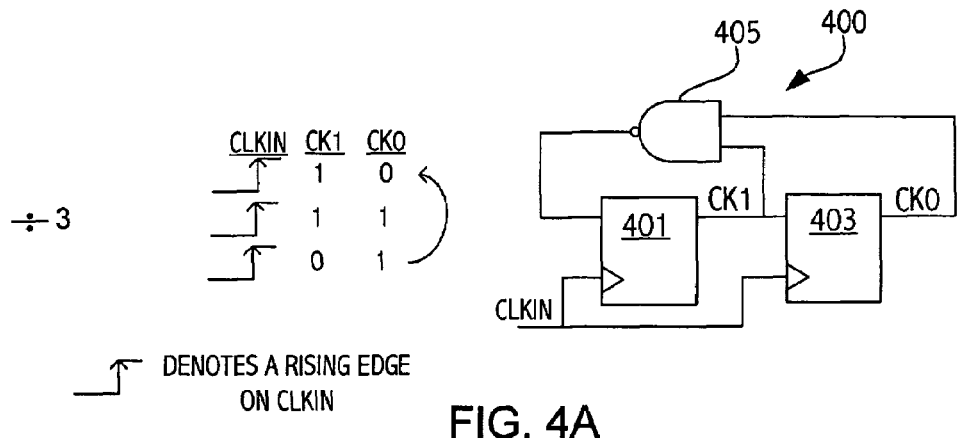
FIG. 4A-4E are exemplary divide circuits providing divide ratios respectively from 3 to 7.

FIGS. 4A through 4E illustrate exemplary implementations of divider topologies using state transitions that are well suited for high speed applications. Referring to FIG. 4A, a divide-by-three circuit 400 is shown that includes two flip-flops 401 and 403 and NAND gate 405. The divide-by-three circuit 400 transitions from state 10 to 11 to 01 and returns to 10. The high speed clock CLKIN to be divided clocks the flip-flops 401 and 403. The output from the divide circuit has a period that is three periods of the input clock CLKIN. Thus, assuming an input clock of 5 GHz (a period of 200 picoseconds), the period of the output clock is 600 ps with each state lasting 200 ps.

Figure 4B:
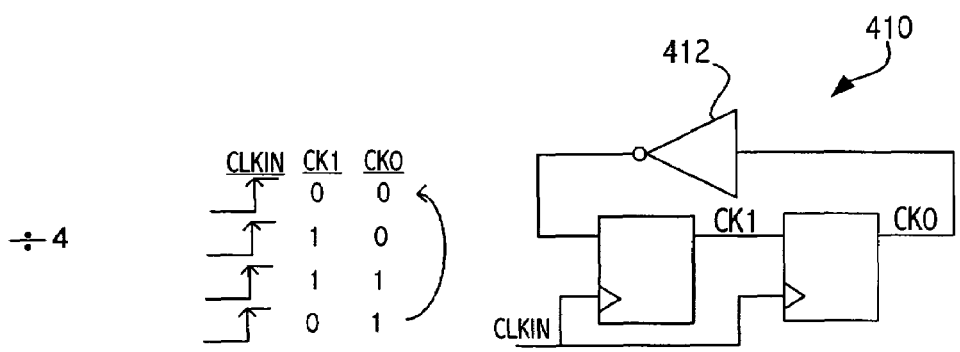
Figure 4C:
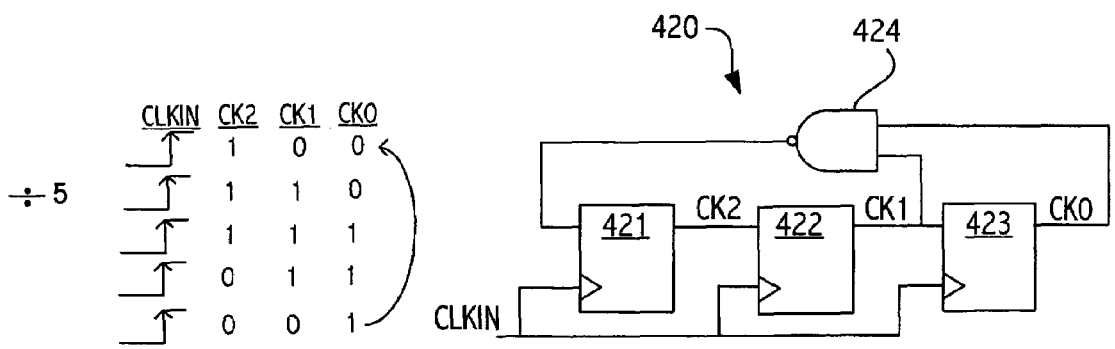

FIG. 4B shows a divide-by-four circuit in which the NAND gate 405 in the divide by three is replaced by an inverter 412. The four states and the state transitions are shown. FIG. 4C shows a divide-by-five circuit 420 implemented using three flip-flops 421, 422, and 423 and NAND gate 424. The flip-flops are clocked by the input clock CLKIN.

Figure 4D:
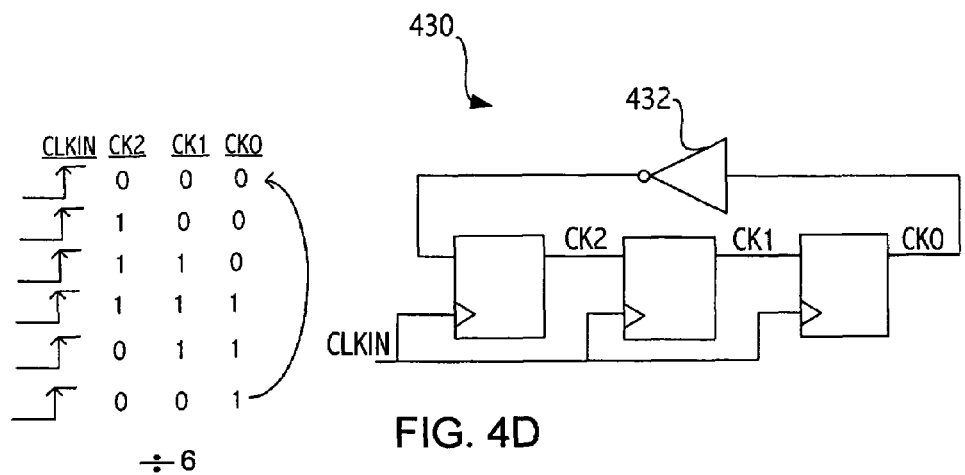
Figure 4E:
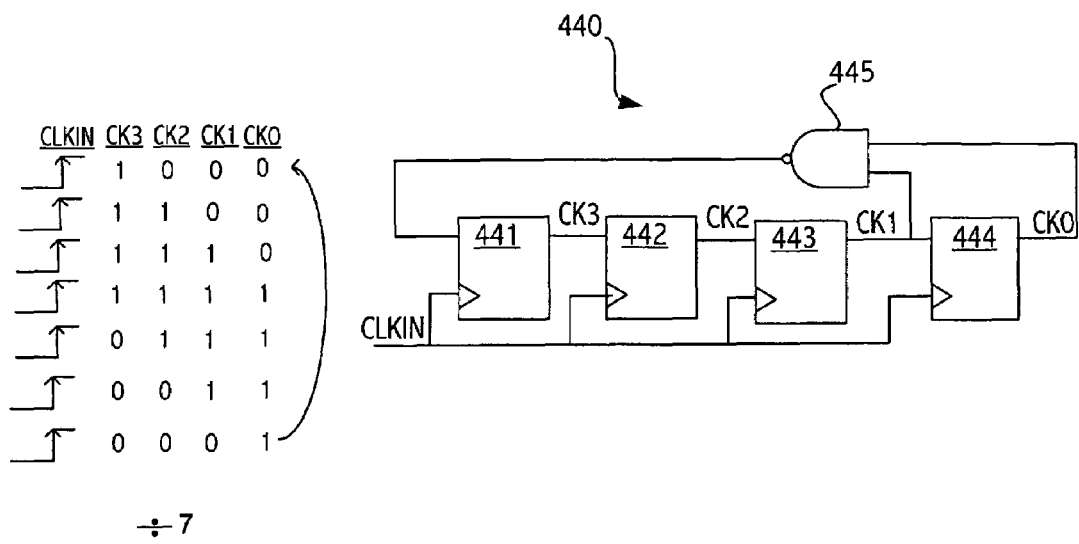

FIG. 4D illustrates a divide-by-6 in which the NAND gate 424 (divide by 5) is replaced with an inverter 432 to achieve the six states and the transitions illustrated in FIG. 4D. FIG. 4E illustrates a divide-by-seven divider 440 in which the state machine is formed by flip-flops 441, 442, 443, and 444 and NAND gate 445. The seven states are illustrated.

Note that the state machines implementing the various divide ratios illustrated in FIGS. 4A-4E are exemplary and other implementations of the state machines may be possible as well as other divide ratios.

Figure 5A:
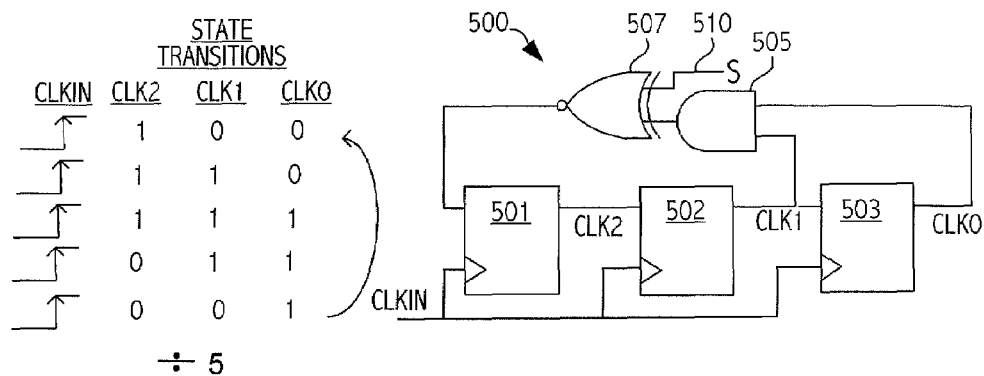
FIG. 5A illustrates an embodiment of a divider state machine and state transitions according to an embodiment of the invention.

Referring now to FIG. 5A, illustrated is an exemplary implementation of a divide-by-5 state machine 500 according to an embodiment of the invention. The-divide by-5 state machine includes flip-flops 501, 502, and 503, and combinational logic formed by AND gate 505 and XNOR gate 507. Note that XNOR gate 507 has an input 510, which is a phase adjust signal described in more detail below.

In the illustrated embodiment, both the phase decrement and increment functions are implemented by using the single XNOR gate 507. A phase decrement is obtained by applying a high ('1') pulse, of duration equal to one input clock (CLKIN) cycle, to the 'S' input 510 on the rising edge of CLK1, which is supplied by flip-flop 502. Similarly, a phase increment is obtained by applying a high ('1') pulse to the 'S' input on the rising edge of CLK0 supplied by flip-flop 503.

Figure 5B:
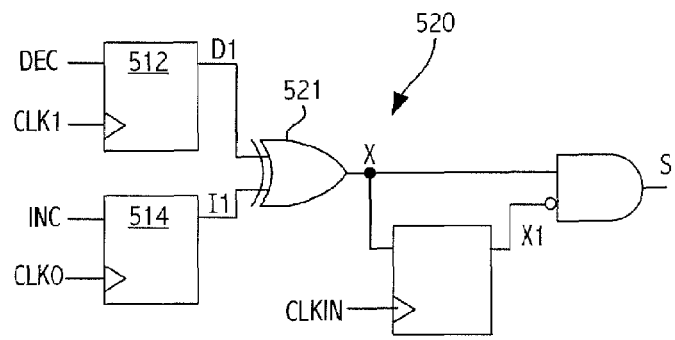
FIG. 5B illustrates an edge detect circuit that detects an assertion of and increment and decrement control signal.

Referring to FIG. 5B, the edge detect circuit 520 detects an increment (INC) or decrement (DEC) pulse and generates the 'S' pulse of duration equal to period of the input clock (CLKIN). The XOR gate 521 in the edge detect circuit combines the two inputs and synchronizes the output 'S' pulse to the appropriate clock to produce a phase decrement or increment. Thus, the S pulse occurs during a different state of the state machine resulting in either a phase increment or decrement based on the current state of the state machine illustrated in FIG. 5A. The XOR gate 521 also prevents a phase increment and decrement from happening at the same time, although in the illustrated embodiment, if the DEC and INC signals rise at the same time a preference is given to the phase decrement (DEC) operation since flip-flop 512 is clocked earlier than flip-flop 514. Additional logic can be utilized prior to flip-flops 512 and 514 to prevent the INC and DEC signals from being supplied to flip-flops 512 and 514 simultaneously.

Figure 5C:
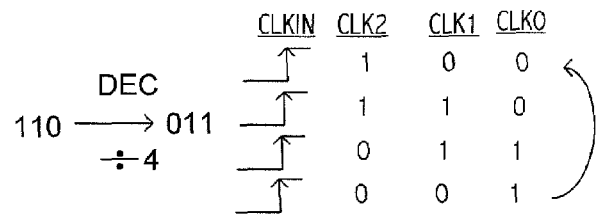
FIG. 5C illustrates states and state transitions for a decrement operation according to an embodiment of the invention.
Figure 6:
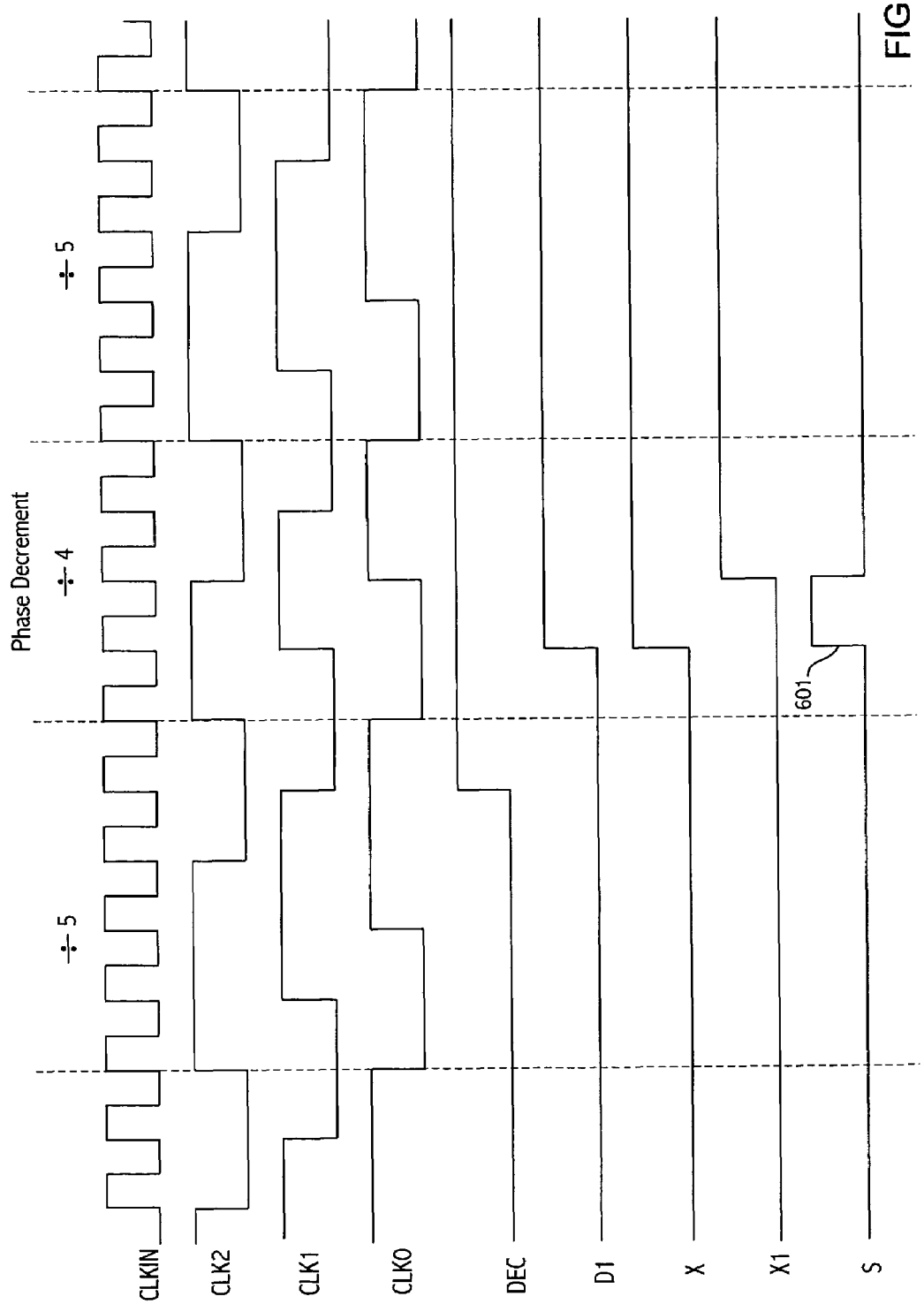
FIG. 6 illustrates a timing diagram for a decrement operation according to an embodiment of the invention.

The states and the transitions for the divide-by-five circuit are shown in FIG. 5A. Each state corresponds to one input clock period, i.e., the clock signal being divided. The phase decrement is implemented by bypassing one of the states in the divide-by-N states. FIG. 5C illustrates the states and transitions for a phase decrement operation. FIG. 6 illustrates a timing diagram of the phase decrement operation for the divide-by-5 circuit with phase adjust shown in FIGS. 5A and 5B. Assertion of the phase decrement signal results in S pulse 601 that lasts for one CLKIN period beginning on the rising edge of CK1. The S pulse causes the state machine to go from state 110 to state 001 bypassing state 111.

Figure 5D:
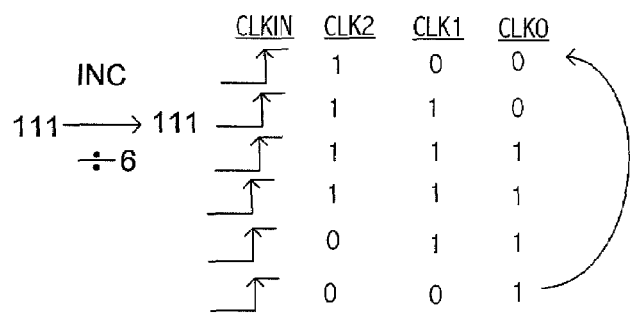
FIG. 5D illustrates states and state transitions for an increment operation according to an embodiment of the invention.
Figure 7:
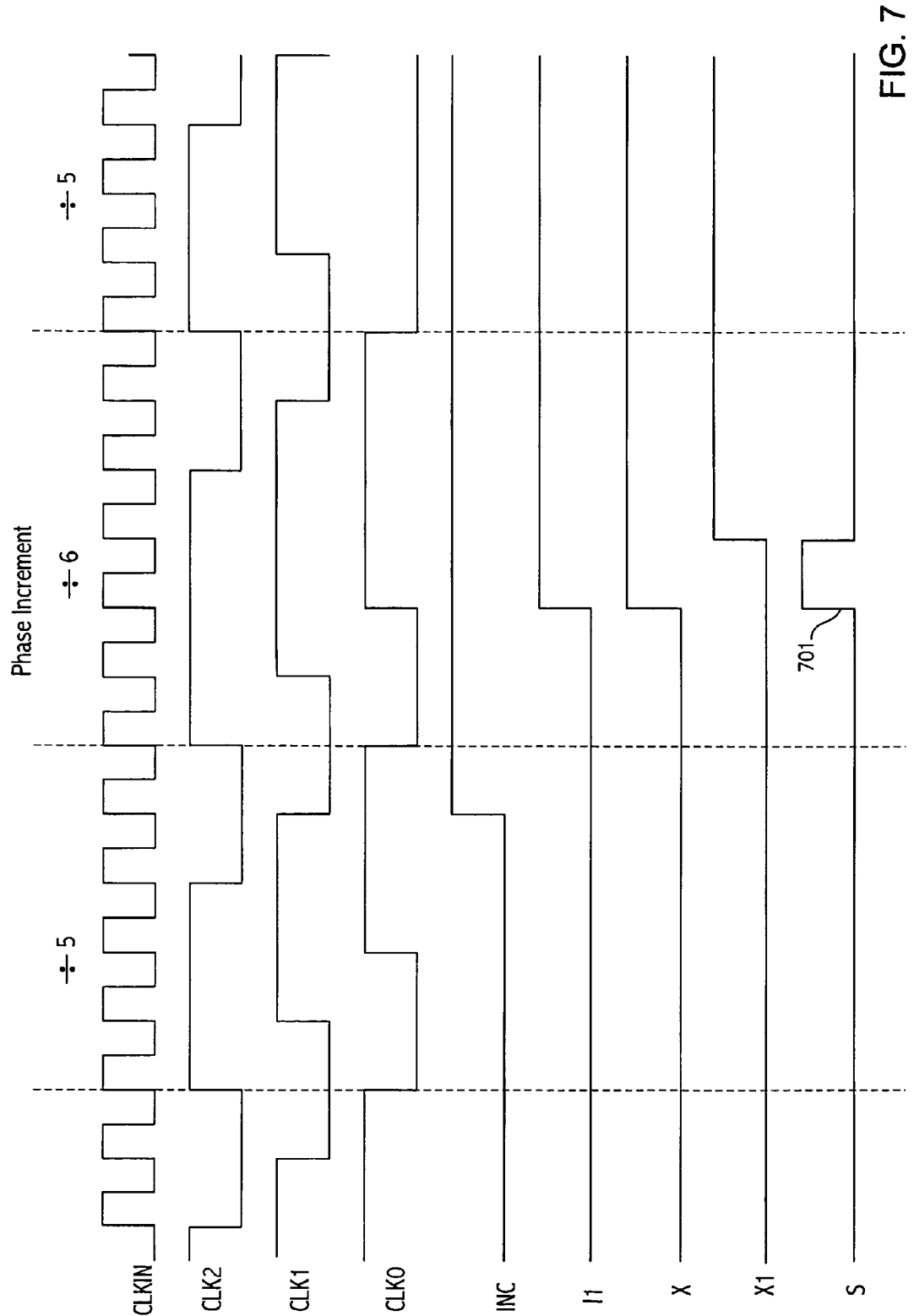
FIG. 7 illustrates a timing diagram for an increment operation according to an embodiment of the invention.

FIG. 5D illustrates states and state transitions for a phase increment operation. FIG. 7 illustrates a timing diagram of a phase increment for the divide-by-5 circuit with phase adjust shown in FIGS. 5A and 5B. Assertion of the phase increment signal results in an S pulse occurring as shown in FIG. 7 that lasts for one CLKIN period beginning on the rising edge CLK0 . The S pulse causes the state machine to insert an additional 111 state following the first 111 state as shown in FIG. 5D. Generally, the phase increment is implemented by introducing at least one additional state into the N states normally present, while the decrement operations involves bypassing one or more of the N states. The bypassing or introduction of a state happens during one low speed clock cycle. That particular cycle of the divided down clock signal will be either one (or more) high speed clock period longer or shorter. Following the phase adjustment cycle, the state transitions cycle returns to normal until another decrement or increment pulse is received again.

While the illustrated embodiment of the invention utilizes a divider with a divide ratio of N=5 as an example, the same idea can easily be extended to other divide ratios, for example the dividers shown in FIGS. 4A, 4B, 4D, and 4E.

Note that the approach to phase adjust described herein may be utilized on a divider circuit that supports multiple divide ratios. For example, note that logic can be utilized to convert the divide by five in FIG. 4C to a divide by 6 of FIG. 4D. For example, a multiplexer may be inserted between the output of flip-flop 422 and NAND gate 424 having one input tied to a logical high and the other to the output of flip-flop 422. In divide-by-five mode the CK1 is selected to be supplied to NAND gate 424 and in divide-by-six mode, the logical one is supplied, converting the NAND gate to the inverter shown in FIG. 4D. More complex logic can be utilized to provide a greater number of divide ratios. However, the tradeoff for a more versatile divider circuit is that the divider circuit has more circuits making successful high speed operation more difficult. To implement the phase adjust in a brute force approach, the divide-by-five shown in FIG. 4C can be converted, with a sufficient amount of logic and control signals, to a divide-by-4 of FIG. 4B for a phase decrement and a divide by 6 of FIG. 4D for a phase increment. However, that brute force approach of changing the divide ratio has to be done using the high speed clock and the switch has to be accomplished cleanly and without glitches. When the clock to be divided (the high speed clock) is operating at 5 or 10 GHz or higher, accomplishing such a brute force transition to a different divide ratio is difficult. The approach described herein of bypassing or adding a state is simpler.

The description of the invention set forth herein is illustrative, and is not intended to limit the scope of the invention as set forth in the following claims. Other variations and modifications of the embodiments disclosed herein, may be made based on the description set forth herein, without departing from the scope and spirit of the invention as set forth in the following claims.

What is claimed is:

1. A method for adjusting a phase of an output signal of a divider circuit including a state machine, the method comprising:
   receiving an input signal at an input of the divider circuit that receives one or more phase adjust control signals;
   when the one or more phase adjust control signals indicate no phase adjust, dividing the input signal by N utilizing N states of the state machine in the divider circuit to provide the output signal equal to the input signal divided by N, N being an integer greater than 2;
   in response to one of the one or more phase adjust signals indicating a phase adjust, implementing a phase adjust of the output signal by adjusting a number of states that occur in the state machine of the divider circuit;
   in response to the phase adjust being a phase decrement indication, implementing a phase decrement by bypassing at least one of the N states to generate one period of the output signal having N−1 or fewer input signal periods for the one period of the output signal; and
   in response to the phase adjust being a phase increment indication, implementing a phase increment by introducing at least one additional state to the N states for one period of the output signal to cause the output signal to have N+1 or more input signal periods for the one period of the output signal.

2. The method as recited in claim 1, further comprising:
   supplying a single control signal to the state machine as the phase increment indication and the phase decrement indication to cause both the phase increment and the phase decrement.

3. The method as recited in claim 2 wherein the control signal is supplied during one state to cause the phase increment and during a different state to cause the phase decrement.

4. The method as recited in claim 2 wherein the single control signal is supplied for one clock period of the input clock signal.

5. A divider circuit coupled to receive an input signal and at least one phase adjustment control signal and supply an output signal, the divider circuit comprising:
   a state machine providing N states, with no phase adjustment, to provide as the output signal the input signal divided by N, each state lasting for one period of the input signal; and
   wherein the divider circuit is responsive to a phase adjustment control signal to adjust a number of states that occur in one period of the output signal to adjust a phase of the output signal.

6. The divider circuit as recited in claim 5 wherein the adjusted number of states occur for one period of the output signal.

7. The divider circuit as recited in claim 5 wherein the state machine comprises a plurality of flip-flops and combinational logic and wherein a phase adjustment control signal is supplied to the combinational logic during one state of the state machine to cause a phase adjustment in a first direction and during another state of the state machine to cause the phase adjustment in a second direction.

8. The divider circuit as recited in claim 5 wherein N is an odd integer.

9. The divider circuit as recited in claim 5 wherein in response to a first decrement control signal to decrement the phase of the output signal, the state machine skips at least one state for one period of the output signal to provide the output signal having N−1 or fewer input clock periods for the one period.

10. The divider circuit as recited in claim 5 wherein in response to a second control signal to increment the phase of the output signal, the state machine inserts one or more states for one period of the output signal to provide the output signal having at least N+1 input clock periods for the one period.

11. The divider circuit as recited in claim 5 wherein in response to a first control signal to decrement the phase of the output signal, the state machine of the divider circuit skips at least one state for one period of the output signal to provide the output signal having N−1 or fewer input clock periods for the one period and wherein in response to a second control signal to increment the phase of the output signal, the state machine of the divider circuit inserts one or more transition states for one period of the output signal to provide the output signal having at least N+1 input clock periods for the one period.

12. The divider circuit as recited in claim 5 wherein in response to a first control signal to decrement a phase of the output signal, a third control signal is provided to the state machine cause the state machine to skip at least one state for one period of the output signal to provide the output signal having N−1 or fewer input clock periods for the one period and wherein in response to a second control signal to increment the phase of the output signal, the third control signal is provided to the state machine to cause the state machine to insert one or more states for one period of the output signal to provide the output signal having at least N+1 input clock periods for the one period.

13. The divider circuit as recited in claim 12 further comprising a circuit coupled to receive the first and second control signals and supply the third control signal at a time during a state of the state machine determined according to whether the first or second control signal is asserted.

14. An apparatus comprising:
   means for dividing, when phase adjust signals are unasserted, an input signal by N utilizing N state transitions, N being an integer greater than 2 and supplying an output signal representing the input signal divided by N; and
   wherein the means for dividing includes means for implementing a phase adjust in response to one of the phase adjust signals being asserted, by adjusting a number of state transitions that occur in the means for dividing, and wherein in response to a phase adjust signal indicating a decrement of a phase of the output signal at least one state transition of the means for dividing is skipped and in response to a phase adjust signal indicating an increment of the phase of the output signal, at least one extra state transition is inserted in the state transitions occurring during a period of the output signal.

* * * * *

UNITED STATES PATENT AND TRADEMARK OFFICE
CERTIFICATE OF CORRECTION

| | |
|---|---|
| PATENT NO. | : 7,459,948 B2 |
| APPLICATION NO. | : 11/170957 |
| DATED | : December 2, 2008 |
| INVENTOR(S) | : Srisai Rao Seethamraju |

It is certified that error appears in the above-identified patent and that said Letters Patent is hereby corrected as shown below:

Col. 6, line 33, replace "machine cause" with --machine to cause--
Col. 6, line 58, replace "signal at" with --signal, at--

Signed and Sealed this

Tenth Day of February, 2009

JOHN DOLL
*Acting Director of the United States Patent and Trademark Office*